United States Patent [19]
Kim et al.

[11] Patent Number: 5,278,438
[45] Date of Patent: Jan. 11, 1994

[54] ELECTRICALLY ERASABLE AND PROGRAMMABLE READ-ONLY MEMORY WITH SOURCE AND DRAIN REGIONS ALONG SIDEWALLS OF A TRENCH STRUCTURE

[75] Inventors: Manjin J. Kim, Ossining, N.Y.; Jein-Chen Young, San Jose, Calif.

[73] Assignee: North American Philips Corporation, New York, N.Y.

[21] Appl. No.: 810,250

[22] Filed: Dec. 19, 1991

[51] Int. Cl.⁵ ............... H01L 29/68; H01L 29/06; G11C 11/34
[52] U.S. Cl. ............................ 257/316; 257/397; 257/398; 257/618; 257/408; 365/185; 437/35
[58] Field of Search ............ 357/23.5, 55, 23.9, 357/23.3, 91, 23.6; 257/316, 397, 398, 618; 365/185

[56] References Cited

U.S. PATENT DOCUMENTS

| | | | |
|---|---|---|---|
| 4,797,718 | 1/1989 | Schubert | 357/23.9 |
| 4,912,535 | 3/1990 | Okumura | 357/23.6 G |
| 5,043,787 | 8/1991 | Soclof | 357/55 |
| 5,053,839 | 10/1991 | Esquivel et al. | 357/23.5 |
| 5,084,418 | 1/1992 | Esquivel et al. | 437/52 |
| 5,218,221 | 6/1993 | Okumura | 257/336 |

FOREIGN PATENT DOCUMENTS

| | | | |
|---|---|---|---|
| 56-30768 | 3/1981 | Japan | 357/23.9 |
| 2-7475 | 1/1990 | Japan | 357/23.9 |

*Primary Examiner*—Rolf Hille
*Assistant Examiner*—Robert Limanek
*Attorney, Agent, or Firm*—David Schreiber

[57] ABSTRACT

A nonvolatile storage device is provided with at least one stacked poly gate structure formed on the substrate and disposed between a first trench and a second trench. The trenches each having two walls. A first doped area having a first conductivity type extending along the wall of the first trench and a second doped area having a second conductivity type extending along the wall of the second trench. The first doped area and the second doped area having heights greater than widths, the heights being parallel to the trench walls and the widths being perpendicular thereto. The trench walls are lined with a metal silicide to decrease resistivity.

12 Claims, 5 Drawing Sheets

ELECTRICALLY ERASABLE AND PROGRAMMABLE READ-ONLY MEMORY WITH SOURCE AND DRAIN REGIONS ALONG SIDEWALLS OF A TRENCH STRUCTURE

BACKGROUND OF THE INVENTION

This invention is in the field of nonvolatile memory devices, and specifically relates to Electrically Erasable and Programmable Read-Only (EEPROM) devices.

EEPROM devices in general, and methods for making such devices, are well known in the art. Typically, an EEPROM memory cell structure has a source region, a drain region, a floating gate, a control gate, and a dielectric layer isolating the control gate from the floating gate.

The source and drain regions are typically disposed as lateral doped areas as shown in U.S. Pat. No. 4,698,787, U.S. Pat. No. 4,796,228 and U.S. Pat. No. 4,849,369. Such configurations take up a significant amount of horizontal space in the memory cell structure because the surface source and drain areas are defined by conventional photolithography.

The source and drain regions have also been disposed as vertical doped areas in a trench structure which also contains gate regions as shown in U.S. Pat. No. 4,979,004. Such devices include pleated gates that are less reliable than the typical stacked poly gate or mesa structure. Defects of the semiconductor material concentrate in the bottom of the trench, where the pleated gate structure is located, thus making the pleated gate devices vulnerable to such defects.

Another disadvantage to the prior art is that individual electrical contacts must be connected to each gate, source and drain region. This requires quite an extensive amount of conductive interconnections and space. Such contacts to the drain, for example, have been made by a silicide film pad and selective tungsten plugs as described in an article by Y.S. Hisamune, et al., *A 3.6um² Memory Cell Structure for 16MB EPROMS*, IEDM 89-583. Such technology requires multilayers of metallization in order to achieve operability of such contacts including at least one layer of metallization for word lines and at least one additional layer for bit lines. Thus, for a high density memory the current state of art requires complicated production and manufacturing processes. Such complicated processes are expensive.

Therefore, there has been a long standing need for a high density, reliable EEPROM structure with a reduced memory cell area that is contactless with only a single layer of metallization.

SUMMARY OF THE INVENTION

A principal object of the present invention is to provide a nonvolatile memory device that decreases the memory cell area by using a contactless and fully self-aligned structure.

Another object of the present invention is to provide a reliable EEPROM with a reduced memory cell area.

Another object of the present invention is to provide an EEPROM that eliminates individual contacts to each source and drain.

Another object of the present invention is to provide an EEPROM with only a single layer of metallization, resulting in a reduced production cost.

These and other objects are achieved by the present invention which includes, a nonvolatile storage device including at least one poly-dielectric gate structure formed on a substrate and disposed between a first trench and a second trench. The trenches include a first doped area extending along a wall of the first trench and a second doped area extending along a wall of the second trench. The first doped area and the second doped area have heights greater than widths. The heights are measured parallel to the trench walls and the widths are measured perpendicular thereto.

The poly gate structures are also referred to as mesas. In an array of such mesas, organized as rows and columns of mesas, there is an alternating structure of columns of mesas and trenches so that each column of mesas is bordered on two opposite sides by a column of trenches. The trenches can be disposed as columns where each column of mesas is between two columns of trenches or the trenches can be disposed as rows where each row of measas is between two rows of trenches. The present invention is directed to the case where the trenches run parallel to the columns of mesas. On the ends of such an alternating structure are columns of trenches.

Thus, each trench between two mesas further includes a second wall separated from the first wall by a bottom area. The second wall of the trench also includes a doped area extending along the second wall of the trench. Each such trench wall is common to a column of mesas. The doped areas on the trench walls form the source and drain regions for the mesas. A channel stopper can also be made by doping an area extending along the bottom of each trench.

Electrical contacts for bit lines or for each doped area in a column of mesas can be made by one electrical contact at the end of each column or trench wall since each trench wall is common to a column of mesas. The contact at the end of a trench wall along with a contact for a gate of the mesa properly indicates which gate is to be read from or written to or erased.

In order to improve conductivity of the doped areas along the walls of the trenches, a conductive silicide can be formed in the doped areas in regions traversing the trench walls.

In one embodiment of the invention the doped areas can be formed by an angle implantation method on the trench walls and bottom. Such a method selectively forms source, drain and channel stopper areas electrically isolated from one another. Each trench wall is doped in one implantation step by a proper selection of the implantation angle. The doped areas provide source and drain regions for an entire column of mesas. The bottom of one trench can also be doped in one vertical implantation step and form channel stoppers for two doped walls of a trench.

An advantage of the invention is that the poly gate structure and trench walls form a mesa structure where the source and drain regions are formed on the sidewalls of the mesas. Thus, the source and drain areas are buried in the substrate which drastically reduces the amount of space a storage cell requires. This allows more storage cells to be packed in a smaller area.

Another advantage of the present invention is that only a single metallization layer extending across a top surface of the substrate is needed. Such a layer is for word lines or contacts to each mesa. The source and drain contacts can simply be made at the end of a trench wall. The source and drain areas are thus buried. This drastically reduces the number of the drain or source contacts and reduces production costs.

The present invention provides a compact storage device that is contactless, fully self-aligned and reliable for high densities.

Other objects, features and advantages of the invention will become apparent from the following detailed description, appended claims and the accompanying drawing.

BRIEF DESCRIPTION OF THE DRAWING

The invention will now be described in detail with respect to several preferred embodiments with reference to the accompanying drawing, wherein.

DESCRIPTION OF THE PREFERRED EMBODIMENTS

Figure 11:
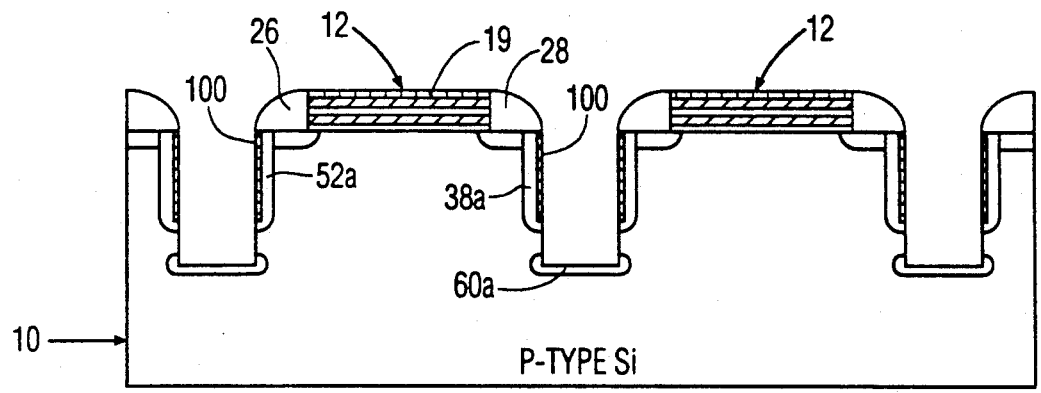
Figure 12:
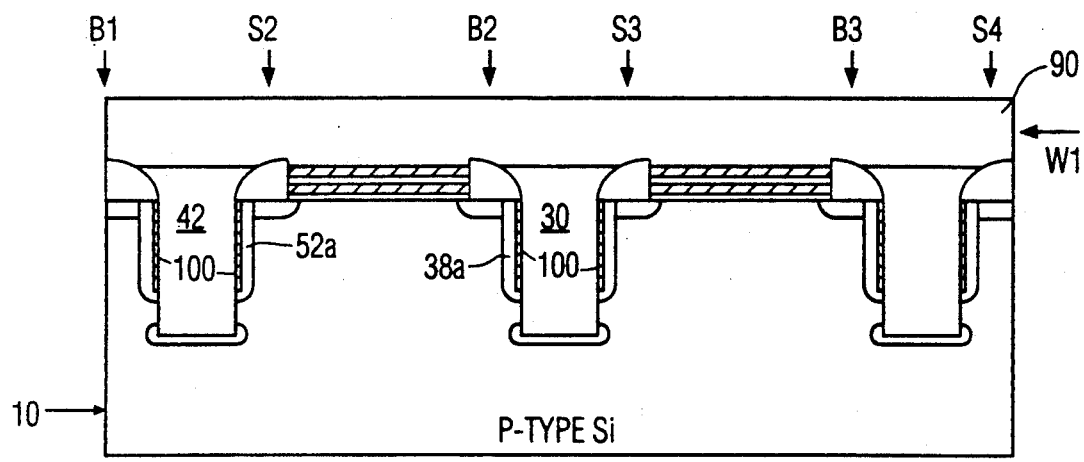
Figure 13:
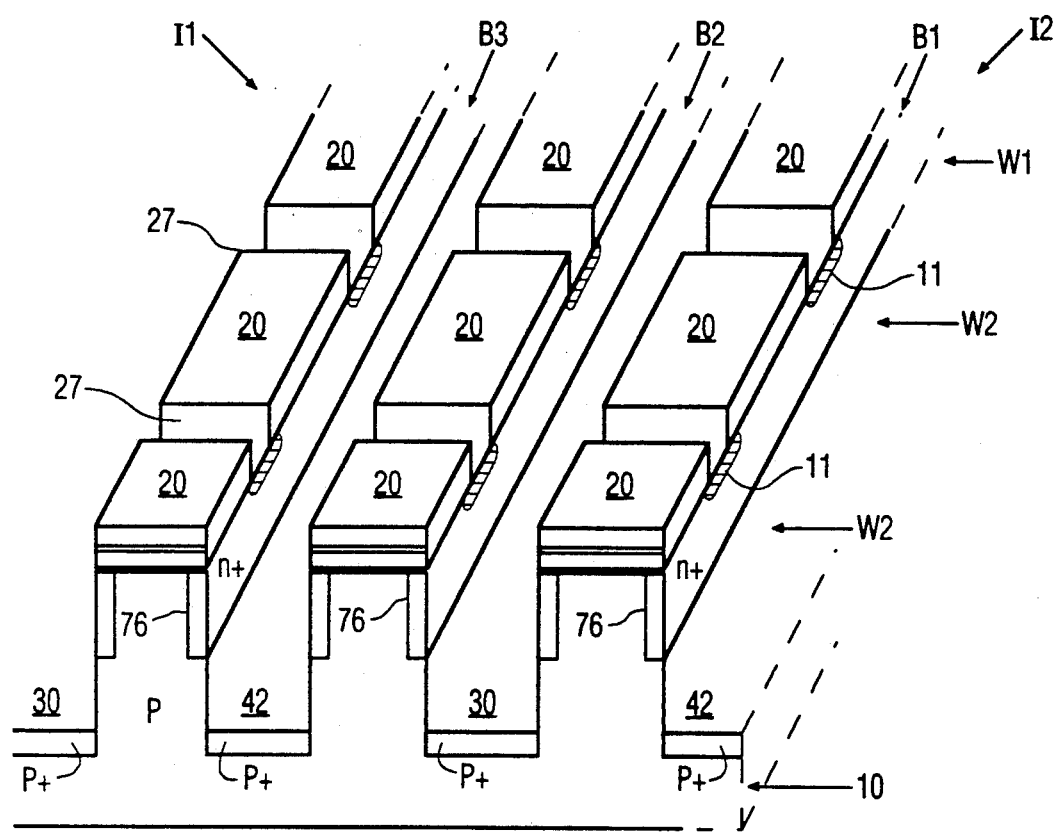
FIG. 13 is a perspective view of EEPROM device fabricated in ac with the invention at an intermediate stage of manufacture.

The basic structure of the present invention is best shown by first referring to the perspective view of a device fabricated in accordance with the invention at an intermediate stage of manufacture as shown in FIG. 13, and then referring to the fabrication sequence shown in FIGS. 1-12.

FIG. 13 shows stacked poly gate cells 20 on a planar surface of a substrate 10 in accordance with the invention after filling (not shown), planarization (not shown) and poly gate isolation, but before metallization. The filling and planarization is not shown in FIG. 13 in order to simplify the drawing and better show the individual stacked poly gate cells 20. A stacked poly gate cell 20 is formed between two trenches 42, 30 and is sometimes referred to as a mesa.

Figure 1:
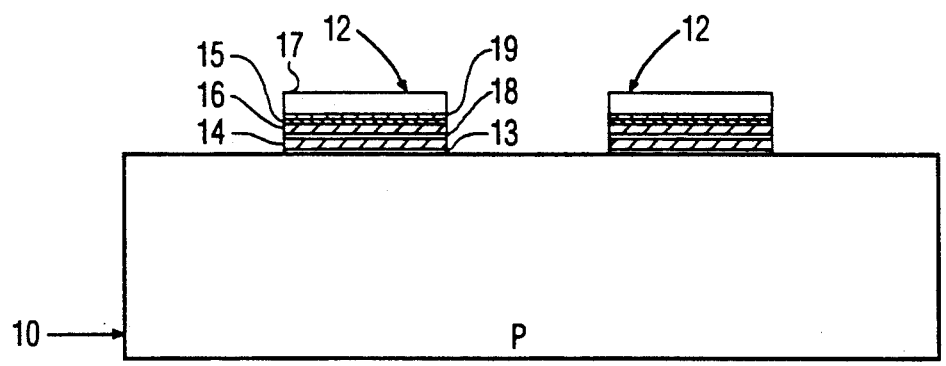
FIG. 1 is a cross-sectional view of two columns of stacked poly gate structure formed on a substrate in accordance with the FIG. 2 is a further view of the device of FIG. 1.
Figure 2:
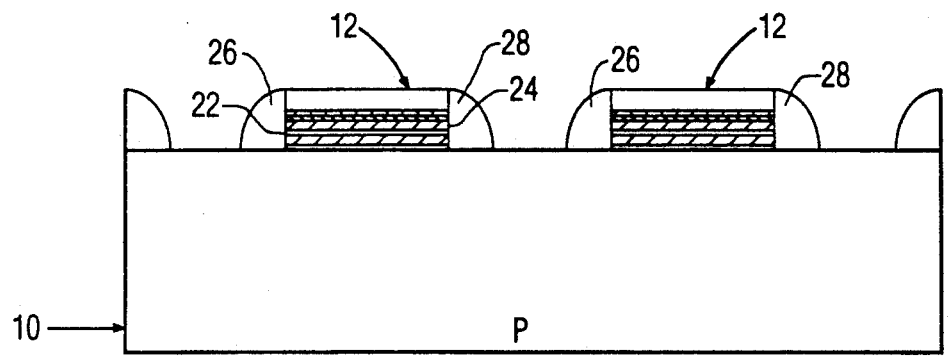
Figure 3:
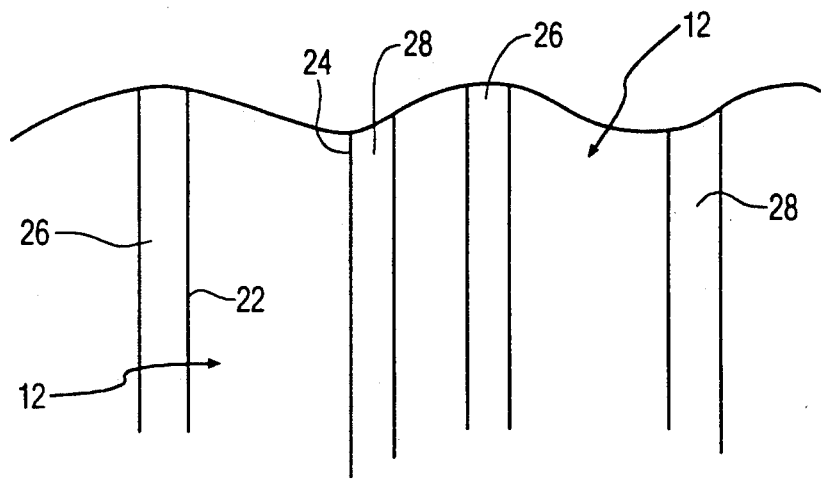
FIG. 3 is a top plan view of the device of FIG. 2.

A typical mesa has an active area that can be formed by conventional semiconductor fabrication methods. Such methods are generally known in the art. Initially, selective oxide stripes 11 are formed on the substrate by a method of local oxidation of silicon (LOCOS). Then a stack of thin films are grown on the substrate. The stack of films are etched to form columns of a stacked poly gate structure 12 as shown in FIG. 1. The stack of thin films include a gate oxide 13 for charge transferring, a poly-1 layer for a floating gate 14, an inter poly dielectrics layer or ONO (oxide-nitride-oxide) layer 18 to insulate the floating gate, a poly-2 layer for word lines or a control gate 16, a pad oxide 15 to protect the poly-2 layer 16 and a layer of nitride 19 for selective oxidation and self-aligned contact. Also deposited is a thick low temperature oxide (LTO) layer 17 for masking during trench etching.

Columns of the stacked poly gate structure 12 are defined and formed by photolithography and a reactive ion etching (RIE) chemistry method. The stacked films are anisotropically etched to produce parallel columns of the stacked poly gate structure 12 as shown in FIG. 1. The columns of the stacked poly gate structure 12 are made perpendicular to the selective oxide stripes 11 formed by LOCOS before the film stripes were grown. A partial view of the oxide stripes are shown in FIG. 13. The orientation between the oxide stripes 11 and the columns of stacked poly gate structure is important, as will become apparent later, because the oxide stripes 11 form an etch stop when the columns of the stacked poly gate structure 12 are etched in a further step, described later, to form isolated poly gates 20.

A column of the stacked poly gate structure 12 includes a first side 22 and a second side 24. The first side 22 and the second side 24 are substantially parallel. See FIGS. 2-3.

A second LTO deposition is made followed by another anisotropic etching to form oxide spacers 26, 28 on the sides of the column of the stacked poly gate structure 12 in order to insulate the sides. A first spacer 26 is located on the first side 22 of the column 12 and a second spacer 28 is located on the second side 24 of the column 12. The size of the spacers can be controlled by the thickness of the second LTO deposition.

Figure 4:
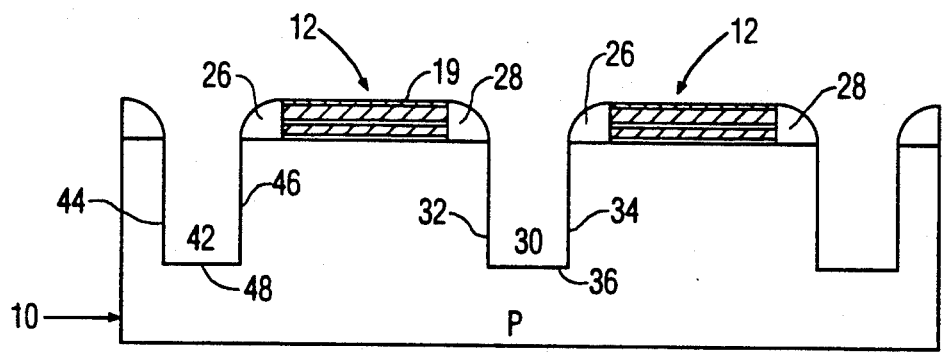
FIGS. 4-6 a cross-sectional view, a fabrication sequence for an EEPROM device in accordance with an embodiment of the invention.

Using the first LTO layer as an etching mask, trenches 30, 42 are formed by continuing the RIE method above using selective chemicals. The etching chemistry and/or the first LTO layer thickness can be controlled so as to expose the nitride layer 19 at the completion of the trench etching as shown in FIG. 4.

The trenches 30, 42 each include two walls 32, 34, 44, 46, respectively, and a bottom 36, 48. The trench walls 32, 34, 44, 46 are shown substantially parallel to the first side 22 and the second side 24 of the column of stacked poly gate structure 12. Each trench wall 32, 34 is lined up with an end of a spacer 28, 26 so that the end of the spacer 28, 26 essentially forms an extension of the trench wall 32, 34.

Each column of stacked poly gate structure 12 is between two trench walls 46, 32 with each wall being from a different trench 42, 30. For example, as shown in FIG. 4, a first wall 32 of a first trench 30 is located under a first spacer 28 of a column 12 while a first wall 46 of a second trench 42 is located under a second spacer 26 of the same column 12. A second wall 34 of the first trench 30 is located under a spacer 26 of a different column of gate structure 12. Simply, a trench with two walls borders two columns of stacked poly gate structure and an end trench with one wall borders one column of stacked poly gate structure.

Figure 5:
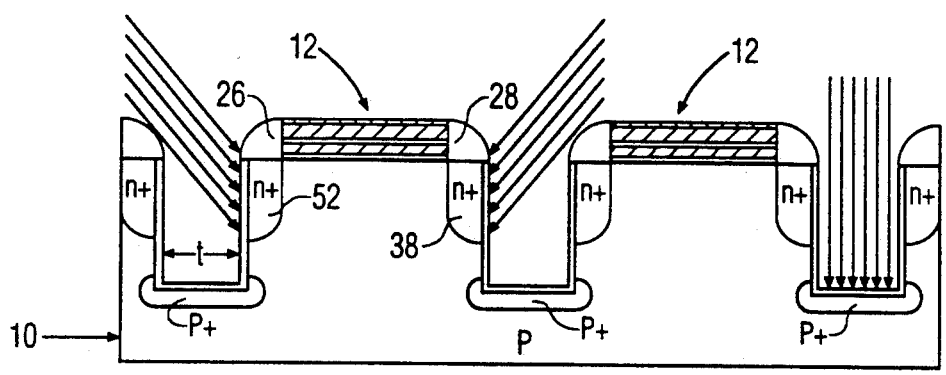

As shown in FIG. 5, doped areas 38, 52 are formed along at least part of the trench walls 32, 46 and are located at least partially under the spacers 28, 26 that border the sides of the poly gate structure 12. The doped areas 52, 38 form the source and drain regions for the column of stacked poly gate structure 12. The doped areas have heights (h) 70 which are measured parallel to the trench walls and widths (w) 80 which are measured perpendicular to the trench walls. See FIG. 6. The heights 70 of the doped areas are greater than the widths 80. Thus, the source and drain regions are vertically oriented under the spacers and along the trench walls. Such a stacked poly gate configuration only takes up a space of about 0.4 microns or less whereas the conventional horizontally orientated source and drain regions take up at least a few microns.

The doped areas along the trench walls and bottom can be formed by an ion implantation method. FIG. 5 shows by direction arrows how a selective ion implantation can be done on each trench wall and trench bottom by controlling an implantation angle. Ion implantation is done in a vacuum environment with an ion source, or atoms able to emit ions. Typically ion sources for N+doping are phosphorus (P) or arsenic (As). Arsenic is preferred is this case because arsenic causes less lateral spreading than phosphorus. Under the influence of electrical and magnetic fields the ions are accelerated and shot into the silicon substrate. Both sides of the trench walls are implanted with a change of the implanting beam direction. The doped areas height can be adjusted with a change in the implanting beam angle. The lateral diffusion can be easily controlled to minimize the gate over-lapping capacitance. The conductivity of the buried source and drain regions can be improved by decreasing the angle of implantation, with a simultaneous increase of trench depth.

The bottom of the trench can be doped with a P type dopant if a channel stopper is necessary. The P type dopant can be implanted with boron in the vertical direction so that a P+ doped area is formed at the bottom of the trench.

For a trench width of t the implanatationangle $\theta$ is equal to $\tan^{-1}(^1_h)$ for implanting on the trench walls and an angle of 90 degrees for implanting on the trench bottom as shown in FIG. 5. A useful dose range is $10^{15}$ to $8 \times 10^{15}$ atoms/cm$^2$ can be implanted with an ionic energy in excess of 100 keV in an acceptable length of time. Typical ion implanters, such as those manufactured by Eaton, can be used.

After completion of the source and drain implantation, the trench is filled in with oxide and planarized to expose the nitride layer 19. Using the initial LOCOS oxide stripes 11 as an etch stop, the column of stacked poly gate structure 12 is etched to isolate independent stacked poly gate cells 20 as shown in FIG. 13. The etching exposes sides 27 of the stacked poly gate cells 20. The exposed sides 27 can be passivated by a thermal oxidation method to form protective oxide on the exposed sides while the nitride layer 19 keeps the poly surface of the cell 20 from oxidation.

Figure 6:
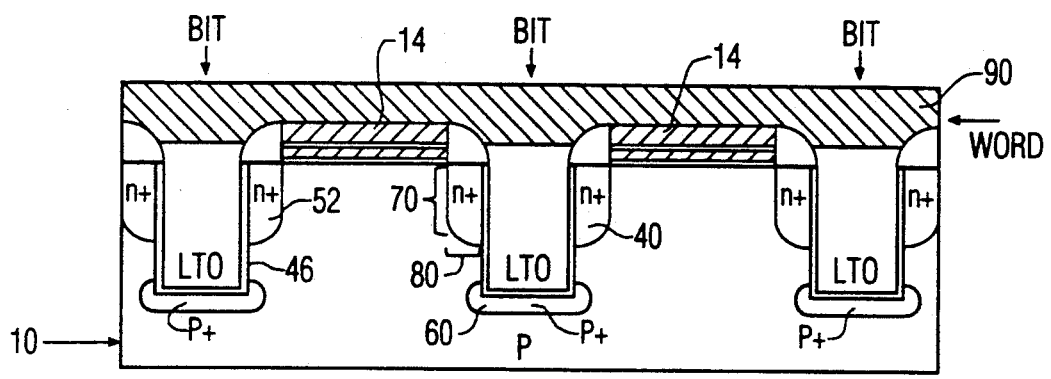
Figure 7:
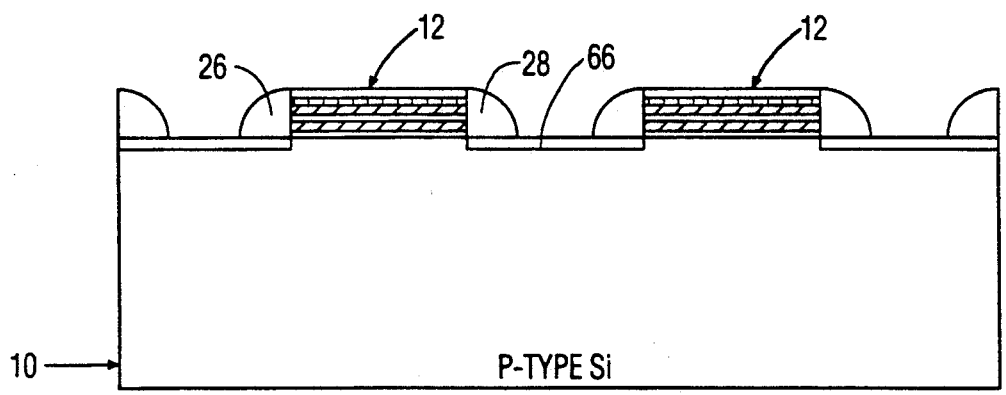
FIG. 7-12 present, in a cross-sectional view, a fabrication sequence for an EEPROM with buried silicide in accordance with an embodiment of the invention.
Figure 8:
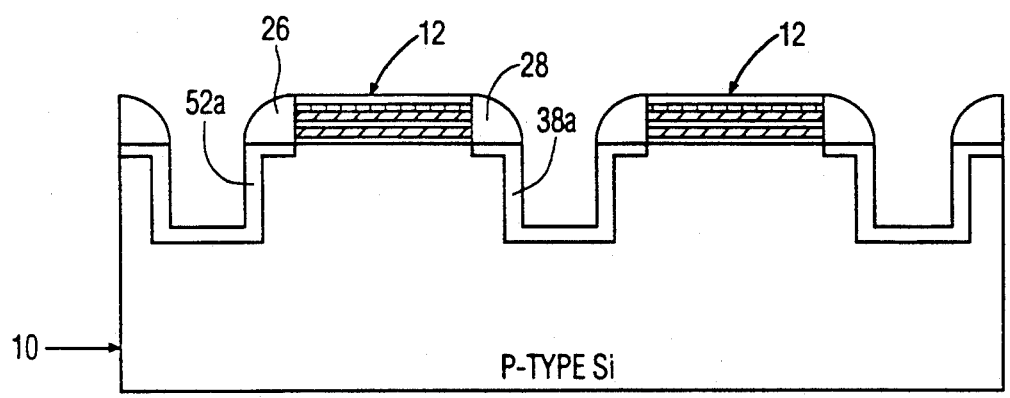

FIG. 6 shows the structure after the nitride layer 19 is selectively etched and after completion of metallization. The nitride layer 19 is selectively etched to expose the top of the poly-2 gate 16 covered by the thin pad oxide 15. The pad oxide 15 is then washed off. For self-aligning contact to the poly-2 gate 16, a metal layer 90 is deposited and patterned to form word lines and to connect each isolated cell 20.

Highly conductive source and drain regions can be made with buried silicide in an alternative method. The method includes making the source and drain regions on the trench walls by diffusion from a gas or doped oxide source. Such diffusion methods are well known in the art. After forming the columns of poly gate structure 12 as shown in FIG. 1, a thin screen oxide is grown and an optional surface source and drain implantation 66 is done. See FIG. 7. Then, a second LTO layer is deposited followed by an anisotropic etching, to form oxide spacers 26, 28.

Using the first LTO layer as an etching mask, trenches can be made by a conventional etching method. After the trenches are made, the vertical source and drain areas 38a, 52a on the trench walls can be formed by a conventional diffusion method. See FIG. 8. In the buried silicide method the doped areas 38a, 52a along the trench walls first form source and drain bases for a column of cells or mesas which are isolated in a further step as described below.

Figure 9:
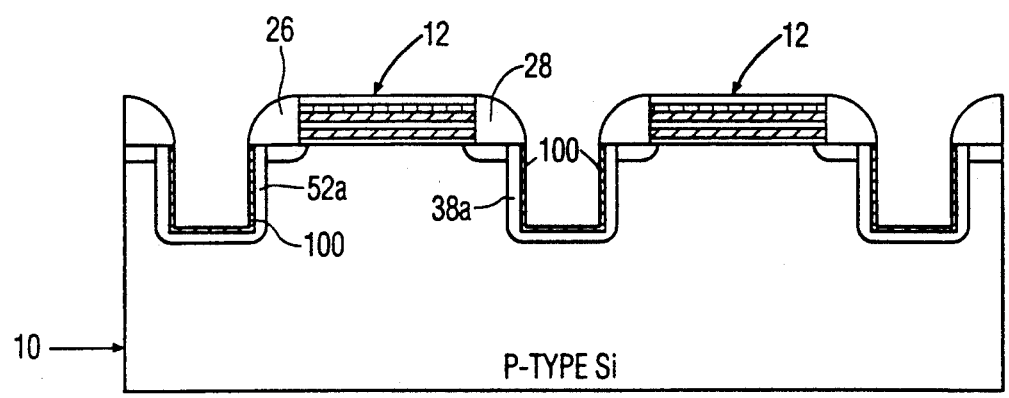

In order to decrease the resistivity of doped areas along the trench walls in such a device, a conductive metal silicide 100 can be formed on the walls of the trench in the doped areas 38a, 52a as shown in FIG. 9. Specifically a metal silicide 100 can be formed in the doped areas 38a, 52a in a region at least partly along the trench walls.

The metal silicide 100 is formed by evaporation in a vacuum system. The silicide 100 can be of any type but is preferred to be of a high conductivity silicide type such as cobalt or titanium silicide. A conductive metal such as cobalt (Co) or titanium (Ti) is vaporized over the substrate surface. It is then sintered to make a silicide (CoSi$_2$ or TiSi$_2$) Since metal does not react with oxide, the silicide can be selectively removed by wet chemical methods leaving silicide 100 on exposed desired areas as shown in FIG. 9. The height of silicide on the trench wall can be increased with the trench depth so that the conductivity of the buried source and drain regions can be improved to near that of a metal line.

Figure 10:
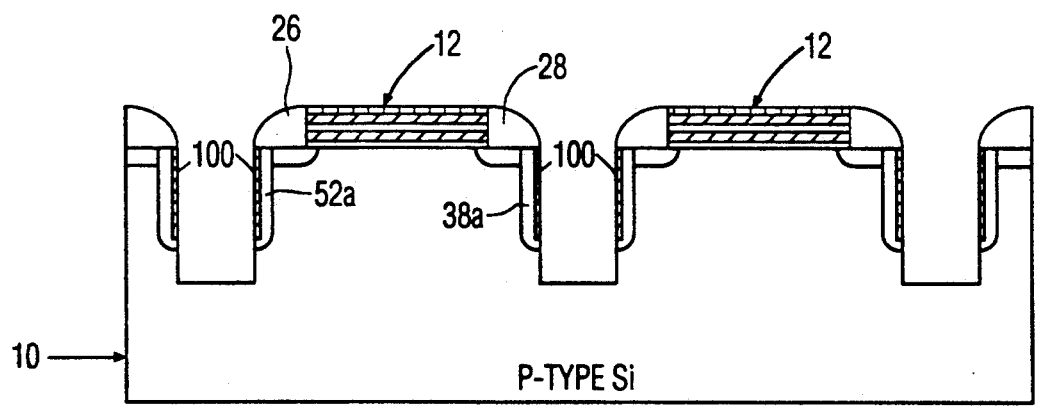

If a source or drain isolation for each gate structure is not required then the silicide covering the entire trench surface can be used as shown in FIG. 9. But if a source or drain isolation is required then the first LTO thickness should be increased so that a second trench etch can be done to isolate the source and drain regions as shown in FIG. 10.

If a channel stopper is needed, a P type dopant can be implanted in the vertical direction so that an isolated P+ region 60a is formed at the bottom of the trench as shown in FIG. 11.

For planarization, LTO or glass is filled into the trench after a surface protection oxidation is done. The trench is planarized to the nitride layer 19 level.

At this point, the columns of the stacked poly gate structure 12 are etched in order to isolate each poly gate or cell 20 as shown in FIG. 13. A selective thermal oxidation is done to form a protective oxide on the poly gate sides 27 exposed by the RIE etching.

For a self-aligning contact, the nitride layer 19 is selectively etched in a wet chemical method to expose the top of the poly-2 gate. FIG. 12 shows the final structure after completion of metallization including the indicated buried bit lines and source lines.

The drain and source regions are now buried in the substrate in the sides of the mesas. Contacts 75 to the drain regions for bit lines can be made at the end of a trench wall. See FIG. 13. Thus, there is no separate metallization layer needed to facilitate bit lines.

FIG. 13 shows an array of nonvolatile memory cells or mesas 20 with a contact 76 at the end of each trench wall for bit lines or for a drain voltage. The amount of space saved by having the source and drain areas buried is in the order of 125% for 1.0u design rules.

While the invention has been described and illustrated in connection with certain preferred embodiments, many variations and modifications, as will be evident to those skilled in this art, may be made therein without departing from the spirit of the invention, and the invention as set forth in the appended claims is thus not to be limited to the precise details of construction set forth above as such variations and modifications are intended to be included within the scope of the appended claims.

We claim:

1. A nonvolatile storage device comprising:
    a substrate;
    at least a first trench and a second trench extending partially into the substrate, each trench having at least one vertical wall;

at least one stacked poly-dielectric gate structure formed on the substrate and disposed between the trenches, the gate structure having a first side and a second side;

a first spacer disposed on the first side of the gate structure and a second spacer disposed on the second side of the gate structure;

a first doped area of a first conductivity type under the first spacer and formed along at least part of a wall of the first trench;

a second doped area of a first conductivity type under the second spacer and formed along at least part of a wall of the second trench; and the first doped area and the second doped area having heights greater than widths, the heights being measured parallel to the trench walls and the widths being measured perpendicular thereto.

2. The device of claim 1, further comprising a conductive silicide formed in the first doped area and the second doped area covering at least part doped areas formed along the trench walls.

3. The device of claim 1, further comprising a third doped area traversing the bottom of each trench, the third doped area having a second conductivity type which is an opposite conductivity type from the first conductivity type.

4. The device of claim 1, wherein the device further comprises a single metallization layer extending across a top surface of the substrate above the gate structure for making contact to the gate structure.

5. The device of claim 1, wherein at least one trench further comprises a second wall separated from the first wall by a bottom; and a third doped area extending along the second wall of the trench.

6. A nonvolatile storage device comprising:

a substrate;

a plurality of parallel trenches extending partially through the substrate;

each trench having a first sidewall and a second sidewall and at least a first doped area traversing one sidewall of the trench without a conductive layer electrically coupling the first sidewall and the second sidewall, each sidewall defining one bitline;

an array of rows and columns of stacked poly gate structures formed on the substrate, each column separating two of the trenches;

the doped areas having heights greater than widths, the heights being parallel to the trench sidewalls and the widths being perpendicular thereto.

7. The device of claim 6, further comprising a second doped area extending along a second wall of each trench; and the second doped areas having heights greater than widths, the heights being parallel to the trench walls and the widths being perpendicular thereto.

8. The device of claim 6, further comprising a conductive silicide formed in the doped areas in regions traversing the trench walls.

9. The device of claim 7, further comprising a third doped area traversing the bottom of each trench and the third doped area having a conductivity type different from the other doped areas.

10. The device of claim 6, wherein the device further comprises a single metallization layer extending across a top surface of the substrate.

11. The device of claim 6, wherein the doped area along one trench wall is common to a column of stacked poly gate structures.

12. A nonvolatile storage device comprising:

a substrate;

at least a first trench and a second trench extending partially into the substrate, each trench having at least one wall;

at least one stacked poly-dielectric gate structure formed on the substrate and disposed between the trenches, the gate structure having a first side and a second side;

a first spacer disposed on the first side of the gate structure and a second spacer disposed on the second side of the gate structure;

a first doped area of a first conductivity type under the first spacer and formed at least partially within and along at least part of a wall of the first trench;

a second doped area of a first conductivity type under the second spacer and formed at least partially within and along at least part of a wall of the second trench;

the first doped area and the second doped area having heights greater than widths, the heights being measured parallel to the trench sidewalls and the widths being measured perpendicular thereto.

* * * * *